(12) United States Patent
Laermer et al.

(10) Patent No.: US 9,032,608 B2
(45) Date of Patent: May 19, 2015

(54) METHOD FOR MANUFACTURING AT LEAST ONE MECHANICAL-ELECTRICAL ENERGY CONVERSION SYSTEM

(75) Inventors: Franz Laermer, Weil der Stadt (DE); Thorsten Pannek, Stuttgart (DE); Ralf Reichenbach, Esslingen (DE); Marian Keck, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1100 days.

(21) Appl. No.: 13/061,919

(22) PCT Filed: Jul. 8, 2009

(86) PCT No.: PCT/EP2009/058655
§ 371 (c)(1),
(2), (4) Date: Jun. 14, 2011

(87) PCT Pub. No.: WO2010/025975
PCT Pub. Date: Mar. 11, 2010

(65) Prior Publication Data
US 2011/0248604 A1 Oct. 13, 2011

(30) Foreign Application Priority Data
Sep. 2, 2008 (DE) .......................... 10 2008 041 755

(51) Int. Cl.
*B23P 21/00* (2006.01)
*B60C 23/04* (2006.01)
*H02N 2/18* (2006.01)
*H01L 41/25* (2013.01)
*H01L 41/313* (2013.01)
(52) U.S. Cl.
CPC .............. *B60C 23/0411* (2013.01); *H02N 2/18* (2013.01); *H01L 41/25* (2013.01); *H01L 41/313* (2013.01)

(58) Field of Classification Search
USPC ............. 29/25.35, 429, 469, 592.1, 831, 837, 29/854; 310/329, 339, 348
See application file for complete search history.

(56) References Cited

U.S. PATENT DOCUMENTS

| 4,180,892 | A | * | 1/1980 | Jensen ........................ 29/25.35 |
| 5,572,081 | A | * | 11/1996 | Starck ............................ 310/329 |
| 6,198,207 | B1 | * | 3/2001 | Lally et al. ..................... 310/348 |
| 6,571,443 | B2 | * | 6/2003 | Lally et al. ..................... 29/25.35 |
| 6,998,761 | B1 |   | 2/2006 | Frank et al. |
| 7,919,907 | B2 | * | 4/2011 | Reichenbach et al. ........ 310/339 |
| 2008/0074002 | A1 |   | 3/2008 | Priya et al. |
| 2009/0206703 | A1 |   | 8/2009 | Reichenbach et al. |

FOREIGN PATENT DOCUMENTS

| DE | 102007006994 | 2/2008 |
| WO | WO 99/08330 | 2/1999 |
| WO | WO 2004/030949 | 4/2004 |

OTHER PUBLICATIONS

International Search Report for PCT/EP2009/058655, dated Nov. 3, 2009.

* cited by examiner

*Primary Examiner* — Paul D Kim
(74) *Attorney, Agent, or Firm* — Kenyon & Kenyon LLP

(57) ABSTRACT

In a method for manufacturing at least one mechanical-electrical energy conversion system including multiple individual parts, and a mechanical-electrical energy conversion, multiple different individual parts are positioned in an assembly device and joined in joining areas assigned to the individual parts in the assembly device, the individual parts including at least one piezoelectric element, one support structure and one seismic mass.

22 Claims, 4 Drawing Sheets

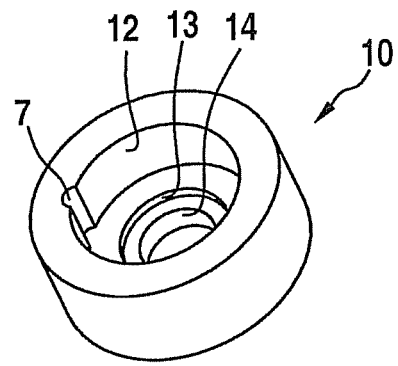
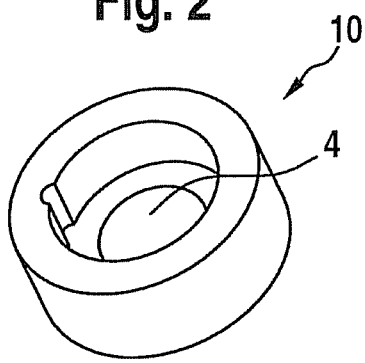
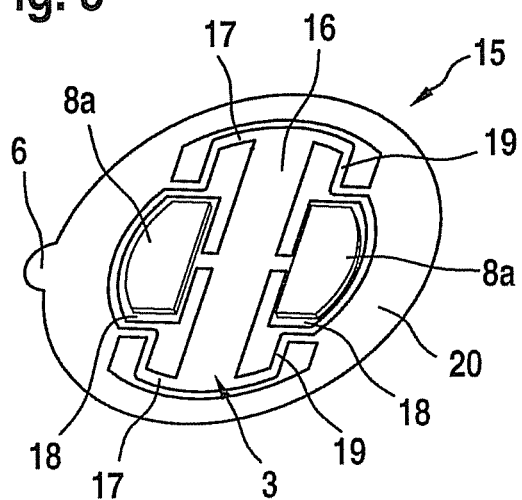
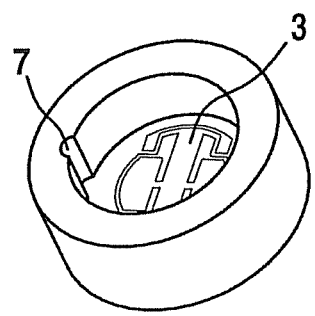
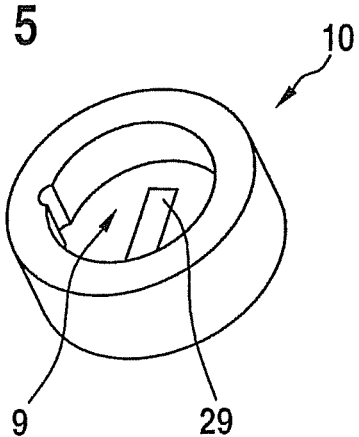
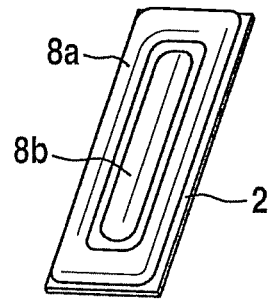

METHOD FOR MANUFACTURING AT LEAST ONE MECHANICAL-ELECTRICAL ENERGY CONVERSION SYSTEM

FIELD OF THE INVENTION

The present invention relates to a method for manufacturing at least one mechanical-electrical energy conversion system, and to a mechanical-electrical energy conversion system.

BACKGROUND INFORMATION

Wireless electronic devices are becoming more and more common. However, energy supply, which is usually ensured by a battery or accumulator, is problematic in devices of this type. These batteries are often large and heavy and must be replaced or recharged.

In applications having low power consumption, other smaller and longer-lasting energy sources may be considered, such as so-called "power harvesting" systems. In these sources, ambient energy, for example in the form of vibrations, is converted to electrical energy using mechanical-electrical conversion. A converter of this type is described, for example, in DE 10 2007 006 994. In particular, the converter described in DE 10 2007 006 994 is designed as a bending transducer. The bending transducer includes a piezoelectric element which is situated in the center of a section of an elastic support structure in the form of a bending bar. Electrodes located on the top and bottom of the piezoelectric element may be used to tap the voltage which is built up by deformation of the piezoelectric element due to vibration of the support structure. A bending transducer of this type may be used, for example, to supply power in a wireless sensor module, for example a sensor module for measuring an internal tire pressure.

Energy conversion systems of this type are complex macromechanical modules whose dimensions are in the millimeter to centimeter range and whose assembly is extremely complex and time-consuming. In particular, nearly all individual parts from which the energy conversion system is assembled must be positioned in relation to each other to form an extremely precise fit with narrow tolerances. As a rule, this results in high packaging costs. To avoid cost disadvantages even in applications where a battery might also be used as an alternative, an economical packaging technique is essential in manufacturing an energy conversion system of this type.

SUMMARY

Example embodiments of the present invention provide a method for manufacturing one or more mechanical-electrical energy conversion systems from multiple individual parts, according to which method at least two individual parts are positioned in an assembly device, and the at least two individual parts are joined in joining areas assigned to the individual parts in the assembly device, an individual part including at least one piezoelectric element, one support structure, one seismic mass and/or one electrode element.

According to example embodiments of the present invention, this makes it possible to economically manufacture one or more energy conversion systems, at the same time meeting the requirements of high precision and short assembly times.

Example embodiments of the present invention provide a mechanical-electrical energy conversion system which is manufactured by a method described herein.

Example embodiments of the present invention are described in greater detail below with reference to the figures.

BRIEF DESCRIPTION OF THE DRAWINGS

FIG. 1 shows an assembly device according to an example embodiment of the present invention;

FIG. 2 shows the assembly device having a first individual part inserted therein, in this case a seismic mass;

FIG. 3 shows a second individual part, which includes a support structure;

FIG. 4 shows the assembly device having the second individual part positioned therein;

FIG. 5 shows the assembly device having a spacer positioned therein;

FIG. 6 shows a piezoelectric element to whose joining areas an adhesive is applied;

DETAILED DESCRIPTION

Figure 7:
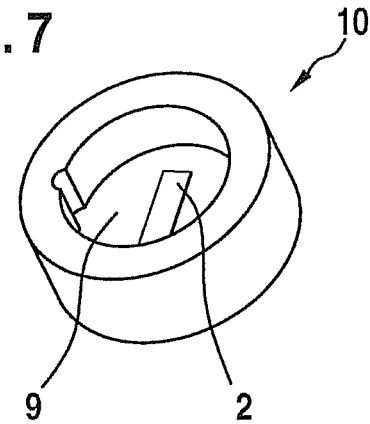
FIG. 7 shows the assembly device having the piezoelectric element positioned therein.
Figure 8:
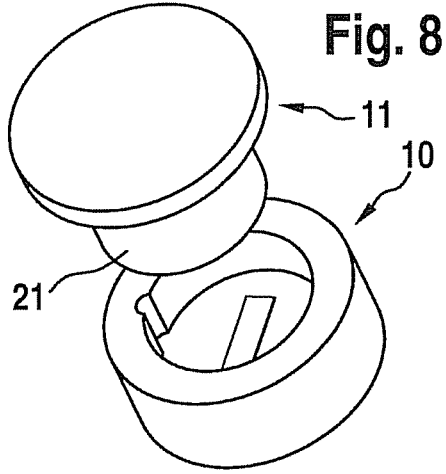
FIG. 8 shows the assembly device and a first pressing element.

Identical or corresponding parts are provided with the same reference numerals in the figures.

FIGS. 1 through 14 illustrate a the method according to an example embodiment of the present invention for manufacturing one or more mechanical-electrical energy conversion systems from multiple individual parts.

FIG. 1 shows an example embodiment of an assembly device 10 used in this method. Assembly device 10 includes a cylindrical, solid body. The cylindrical body has a continuous bore, which is formed by three sections 12, 13, 14. Sections 12, 13, 14 are situated one after the other along the axis of symmetry of the cylindrical body. First, wider section 12 having the largest diameter is followed by narrow second section 13 having a slightly smaller diameter and then third section 14, which has the smallest diameter. A groove 7 is provided in first section 12, this groove being designed as a positioning aid counterpart to a positioning aid 6 of the individual parts, which are explained below.

A first individual part, which is formed by a seismic mass 4, is inserted into assembly device 10 (see FIG. 2). Seismic mass 4, which is designed in the shape of a disk having a plane-parallel top and bottom, is placed on the step formed by the transition from the second section to third section 14 of assembly body 10. The diameter and width of second section 13 correspond to the diameter and height of disk-shaped seismic mass 4, so that the edge of positioned seismic mass 4 terminates flush between first section 12 and second section 13.

A second individual part 15 is subsequently positioned in assembly device 10 on the planar surface formed by seismic mass 4 and assembly device 10 (see FIGS. 3, 4). Second individual part 15 has a circular outer contour which forms an adjusting tab 6 at one point which is used as a positioning aid. The diameter of second individual part 15 corresponds to the diameter of first section 12; adjusting tab 6 is designed to match the profile of groove 7 of assembly device 10. In this manner, it is ensured that the second individual part 15 is positioned in assembly device 10 to form a precise fit.

The second individual part includes a support structure 3. Support structure 3 is divided into a bar-shaped section 16 whose ends are terminated by a sickle-shaped bearing section 17 and from whose middle two wing-shaped fastening sections 18 extend via two connecting webs. Support structure 3 is held via connecting webs 19 on a frame 20, which forms the outer contour of individual part 15 described above. In addition to the function of correctly positioning support structure 3, frame 20 also has a protective function.

First individual part 15 is machined from a solid sheet with the aid of laser machining. The sheet itself is an elastic sheet which is elastically deformable and electrically conductive.

An electrically non-conductive adhesive 8a is applied to wing-shaped sections 18 of support structure 3. Individual part 15 is then positioned in assembly device 10, adhesive 8a facing seismic mass 4. Seismic mass 4 and support structure 3 are joined via adhesive 8a, the surfaces covered by adhesive forming the joining areas.

The next step is to position a spacer 9 (see FIGS. 5 and 9) in assembly device 10. Like in first individual part 15, spacer 9 is machined from a solid sheet by laser machining, i.e., it is designed as spacing sheet 9 and has an appropriate outer contour and adjusting tab 6. In the center, a rectangular section 20 is provided which corresponds to bar-shaped section 16 of support structure 3 in width and length.

In the next step, a pressing element 11 (see FIG. 8) is inserted into assembly device 10, and second individual part 15 and seismic mass 4 are pressed together by the application of pressure. Pressing element 11 is designed in the form of a cover of assembly device 10 which has a cylindrical pressing stamp 21. Cylindrical pressing stamp 21 corresponds to the diameter of first section 12 of assembly device 10 in its diameter and has a flat stamp surface. Pressing element 11 thus makes it possible to evenly distribute pressure and to precisely meter pressure (for example by placing defined weights on pressing element 11). After the pressing action, pressing element 11 is removed from assembly device 10.

In a subsequent step (see FIG. 6), adhesive 8a, 8b is applied to the bottom of a third individual part, in this case a piezoelectric element 2. Piezoelectric element 2 is formed from a piezoelectric ceramic in the shape of a strip having a width which corresponds to the width of bar-shaped section 16 of support structure 3. Piezoelectric element 2 is provided on its top and bottom with a metal coating, which is not illustrated here and which is used as an electrode for tapping the voltage produced by piezoelectric element 2. First adhesive 8a is an electrically non-conductive adhesive 8a which is applied to the outer edge of the bottom of piezoelectric element 2; second adhesive 8b is an electrically conductive adhesive 8b which is applied to the inner area on the bottom of piezoelectric element 2. This "dual adhesive process" prevents adhesive 8b from penetrating unwanted areas, in particular during the joining process, avoiding in particular a short circuit.

Figure 9:
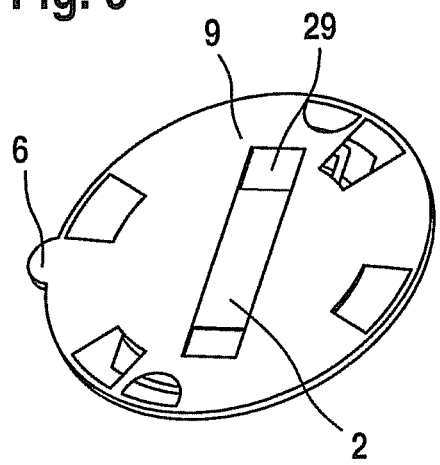
FIG. 9 shows a stack joined from a seismic mass, a second individual part and a piezoelectric element, including spacer.
Figure 10:
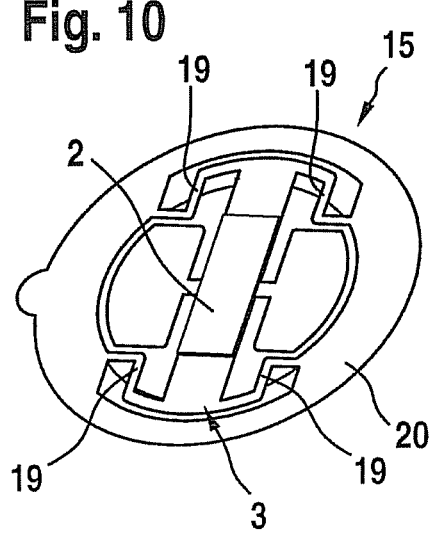
FIG. 10 shows the aforementioned stack without spacer.

Piezoelectric element 2 having adhesive 8a, 8b applied thereto is positioned in assembly device 10 in the middle of rectangular section 29 of spacer 9 (see FIG. 7 and FIG. 9). The bottom having adhesive 8a, 8b faces second individual part 15, in particular bar-shaped section 16.

After piezoelectric element 2 has been inserted into assembly device 10, the stack formed by seismic mass 4, second individual part 15, spacer 9, and piezoelectric element 2 is joined together by pressing using pressing element 11, as previously described above. Spacer 9 ensures that piezoelectric element 2 is spaced a minimum distance apart from support structure 3, in particular from bar-shaped section 16, which prevents an excessive amount of adhesive 8a, 8b from being pressed out during the pressing action avoids and enhances the functionality of the energy conversion system to be manufactured. Accordingly, the thickness of spacer 9 is selected to be larger than the thickness of piezoelectric element 2.

Pressing element 11 is attached to assembly device 10 by retaining clamps, which are not illustrated here, and adhesive 8a, 8b is subsequently cured in an oven.

After the adhesive is cured, the stack (seismic mass 4, second individual part 15, piezoelectric element 2, spacer 9) is removed from assembly device 10. The rear opening in assembly device 10, which is formed by third section 14 and via which the aforementioned stack may be pressed out of assembly device 10, may be used for removal, in particular with the aid of an element which may be designed in the shape of a rod, for example, and which is passed through third section 14. After the stack has been removed, spacer 9 is lifted off (see FIG. 9).

In a subsequent step (see FIG. 10), support structure 3 is removed by separating connecting webs 19, which connect frame 20 to support structure 3. The separation may be carried out manually, for example using a paper cutter, or by machine, for example using a laser. Alternatively, the stack may remain in assembly device 10 for separation.

Figure 11:
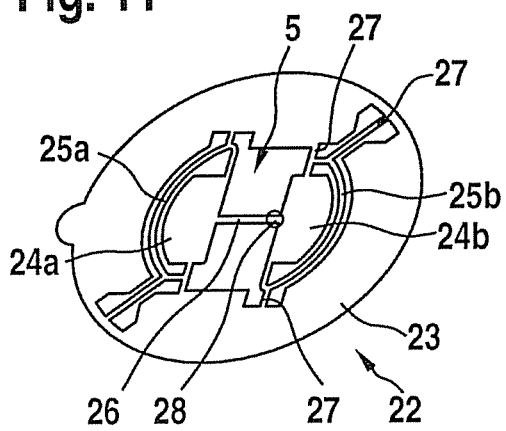
FIG. 11 shows a third individual part, which includes an electrode element.
Figure 12:
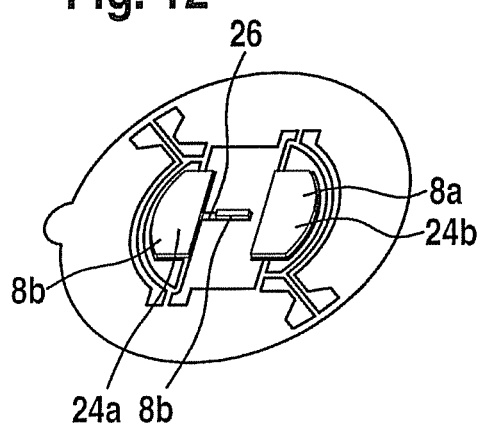
FIG. 12 shows the third individual part, including adhesive applied to its joining areas.

FIG. 11 shows a fourth individual part 22. Fourth individual part 22 includes an electrode element 5 and a frame 23 which encloses and supports electrode element 5. The design of frame 23 is similar to that of frame 20 of second individual part 15, in particular it has the same outer contour and an adjusting tab 6. Electrode element 5 has two wing-shaped sections 24a, 24b, which have a design corresponding to that of wing-shaped sections 18 of support structure 3. A contact path 25a, 25b in the shape of a bow extends from each of wing-shaped sections 24a, 24b. The two diametrically opposed wing-shaped sections 24a, 24b are connected to each other via a connecting web 26. Electrode element 5 is held in frame 23 via multiple fastening webs 27.

Like second individual part 15, fourth individual part 22 is machined from a solid sheet by laser machining. The sheet is made from an electrically conductive material. The top and bottom of fourth individual part 22 are plane-parallel to each other, as are the top and bottom of seismic mass 4, second individual part 15, piezoelectric element 2 and spacer 9.

Connecting web 26 (see FIG. 12) is separated at one end, at end 28 in this case, which ends at second wing-shaped section 24b. An electrically conductive adhesive 8b is applied to the bottom of first wing-shaped section 24a of electrode element 5. Likewise, an electrically conductive adhesive is applied to the bottom of connecting web 26. An electrically non-conductive adhesive 8a, on the other hand, is applied to the bottom of second wing-shaped section 24b of fourth individual part 22.

The stack of seismic mass 4, support structure 3 and piezoelectric element 2, which is joined in layers, is repositioned in assembly device 10 if it was removed therefrom. Fourth individual part 22 is then positioned in assembly device 10, the bottom of fourth individual part 22 on which adhesive 8a, 8b is applied, faces support structure 3 and piezoelectric element 2. The components are then pressed together using pressing element 11 and the adhesive is cured in the oven in the manner already described above. The entire joined stack is subsequently removed from assembly device 14.

Figure 13:
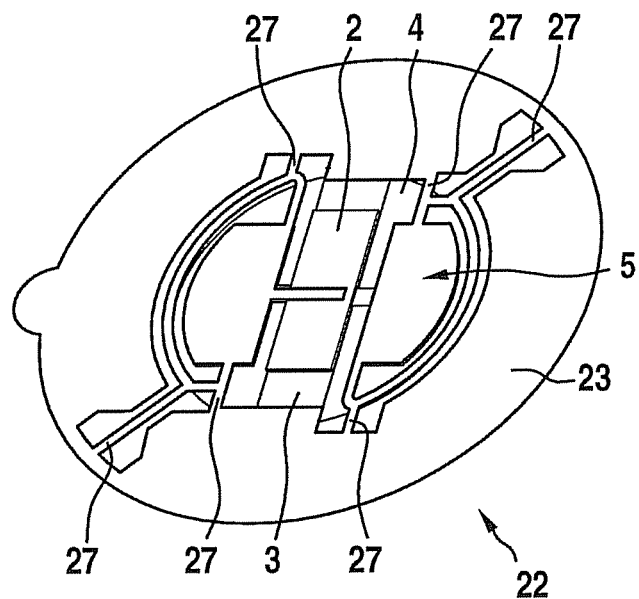
FIG. 13 shows a stack joined from a seismic mass, a second individual part and a third individual part.

FIG. 13 shows the joined stack of seismic mass 4, support structure 3, piezoelectric element 2 and fourth individual part 22 removed from assembly device 10. Electrode element 5 and outer ring 23 are then separated from each other by separating fastening webs 27.

Figure 14:
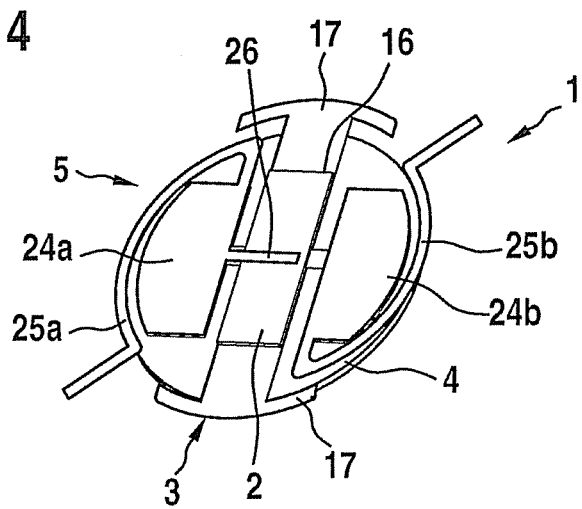
FIG. 14 shows a view of the finished energy conversion system.
Figure 15:
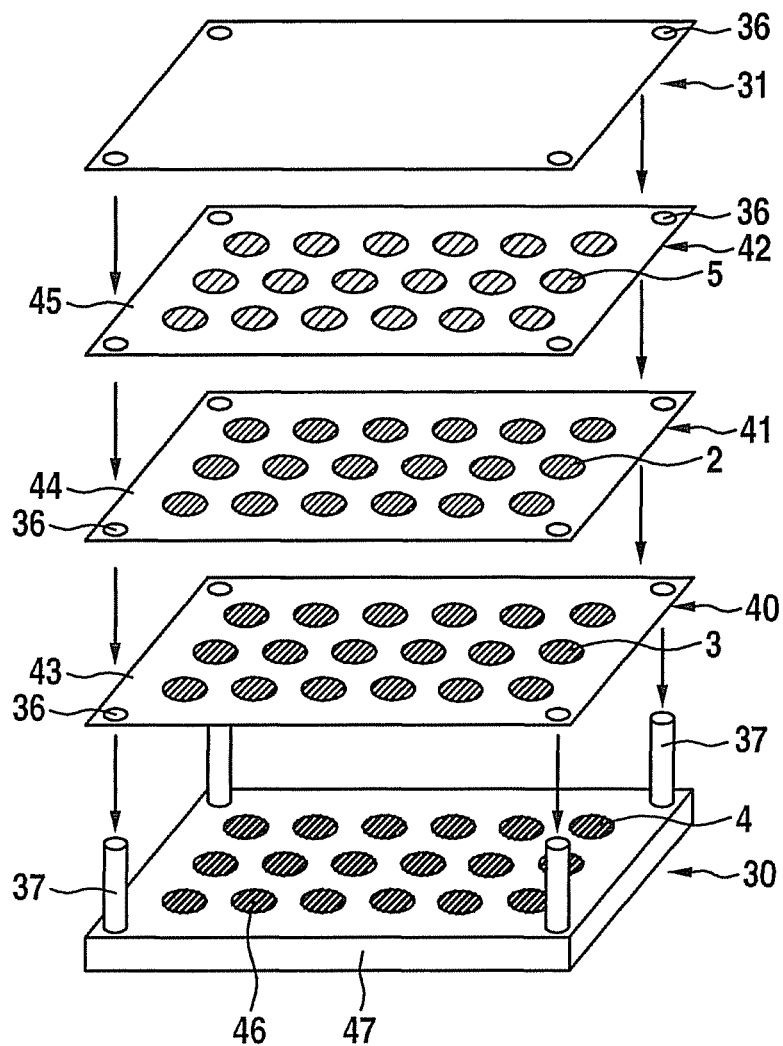
FIG. 15 shows an assembly device according to an example embodiment of the present invention having second arrangements of the individual parts positionable in the second assembly device and a second arrangement of the pressing element.

FIG. 14 shows energy conversion system 1 manufactured according to the method hereof. Energy conversion system 1 may be mounted so it is able to vibrate, via bearing sections 17 of support structure 3, for example in a housing which has a groove corresponding to bearing sections 17. Piezoelectric element 2 is deformed by the vibration of bar-shaped section 16 of support structure 3. The voltage which builds up due to the deformation of piezoelectric element 2 may be tapped on the top of piezoelectric element 2 via connecting web 26, first wing-shaped section 24a and assigned contact path 25a and on the bottom of piezoelectric element 2 via bar-shaped section 16, wing-shaped section 18 of support structure 3, second wing-shaped section 24b of electric element 5 and contact path 25b assigned thereto. Seismic mass 4 is used to adjust the resonance frequency of this vibrating system.

The energy conversion system manufactured in this manner is suitable, for example, as a component of a power supply system for energy-autonomous systems, for example tire sensors which measure tire temperature and/or tire pressure and/or accelerations occurring in tires.

As an alternative to using an adhesive 8a, 8b for joining the different individual parts, a welding process may also be used, for example laser welding or ultrasonic welding. Instead of a circular outer contour of individual parts 15, 22 and spacer 9, for example an angular shape, in particular a square shape, may furthermore be selected. Assembly device 10 must be adapted accordingly. In the case of an angular outer contour, adjusting tab 6 may be dispensed with. In a further alternative, the assembly device may have one or more alignment pins instead of an adjusting tab, and first individual part 15, spacing sheet 9 and fourth individual part 22 may have a corresponding number of holes for inserting the alignment pin.

Alternatively, first individual part 15, spacing sheet 9 and fourth individual part 22 may be produced from one sheet with the aid of a stamping process.

Alternatively, the pressing of seismic mass 4, support structure 3, piezoelectric element 2 and electrode element 5 may be carried out in only a single step using pressing element 11, including curing the adhesive in the oven. Releasing support structure 3 from frame 20 may, in principle, also take place at a later point in time, in particular only after electrode element 5 has been released.

The method may also be used for the parallel manufacture of a plurality of energy conversion systems, which is described below on the basis of a method according to an example embodiment of the present invention.

According to this example embodiment, the second, third and fourth individual components are designed as plane-parallel sheets 40, 41, 42 having a large surface area. Second individual part 40 includes a plurality of support structures 3 situated in a field which are attached to a frame 43 assigned to second individual part 40 via fastening webs (not visible) in a manner corresponding to the example embodiment described above. Accordingly, third individual part 41 has piezoelectric elements 2 held by a frame 44, and fourth individual part 42 has electrode elements 5 likewise held by a frame 45.

The assembly device 30 has a base plate 47 having a large surface area and having a plurality of recesses 46 situated in a manner corresponding to the field which are provided for accommodating first individual parts, in this case seismic masses 4.

For manufacturing energy conversion systems 1, seismic masses 4 are first inserted into recesses 46 of assembly device 30, for example using pick-and-place technology, in this case with the aid of a robot which picks a seismic mass 4 from a supply area and places it in a free recess 46. A further advantageous method for inserting seismic masses 4 into assembly device 30 is to pour and shake seismic masses 4 into provided recesses 46.

Second individual part 40, third individual part 41 and fourth individual part 42 are then stacked on top of each other on assembly device 30. To correctly position individual parts 40, 41, 42, assembly device 30 has four adjusting bolts 37 positioned in the corners as positioning aid counterparts, and individual parts 40, 41 and 42 have through-holes 36 of a matching design. Before they are stacked, particular individual parts 40, 41, 42 are provided with adhesive, according to the example embodiment described above. A pressing element designed as a terminating plate 31 is placed on the stack formed by base plate 47 of assembly device 30, second individual part 40, third individual part 41 and fourth individual part 42. Terminating plate 31 also has through-holes 36, which enable terminating plate 31 to be guided by adjusting bolt 37.

The stack formed by seismic masses 4, support structures 3, piezoelectric elements 2 and electrode elements 5 is pressed together and joined with the aid of terminating plate 31. The adhesive is cured in an oven. After the joined stack has been cured and removed from assembly device 30, individual electrode elements 5, support structures 3 and piezoelectric elements 2 are released from their carrying frames 43, 44 and 45. A plurality of energy conversion systems 1 is manufactured in this manner, as shown in FIG. 14.

What is claimed is:

1. A method for manufacturing at least one mechanical-electrical energy conversion system by positioning multiple individual parts in an assembly device and joining the parts together in joining areas in the assembly device, the method comprising the following steps:
    inserting a first individual part into the assembly device;
    positioning a second individual part on top of a planar surface formed by the first individual part in the assembly device;
    applying pressure to the first individual part and the positioned second individual part;
    positioning a third individual part in the assembly device on top of the positioned second individual part,
    wherein the individual parts include a piezoelectric element, a support structure, and a seismic mass.

2. The method according to claim 1, wherein the individual parts include an electrode element.

3. The method according to claim 1, wherein the multiple individual parts are positioned in layers in the assembly device so that they lie on top of each other in the form of a stack.

4. The method according to claim 3, wherein the stack has the following sequence of individual parts, from bottom to top: the seismic mass, the support structure, the piezoelectric element, and optionally an electrode element.

5. The method according to claim 1, wherein the joining areas of the individual parts are arranged such that the joining areas of the individual parts lie on planes which are parallel to each other when the individual parts are positioned in the assembly device.

6. The method according to claim 1, wherein the multiple individual parts are provided with a planar design having a top and bottom that are largely plane parallel in relation to each other.

7. The method according to claim 1, wherein at least some of the individual parts are first formed to have a matching outer contour and are positioned and joined in the assembly device, and after being joined, at least one individual part is cut in its outer contour.

8. The method according to claim 7, wherein the matching outer contour corresponds to an inner contour of the assembly device.

9. The method according to claim 7, wherein the outer contour is cut at least one of (a) mechanically and (b) by laser cutting.

10. The method according to claim 1, wherein the individual parts include a positioning aid for positioning in the assembly device.

11. The method according to claim 1, wherein the individual parts are connected using at least one of (a) welding, (b) laser welding, (c) ultrasonic welding, and (d) gluing using an adhesive.

12. The method according to claim 11, wherein to join the at least two individual parts using an adhesive, the adhesive is first applied to the joining area of one or both individual parts, and the individual parts are then joined by pressing them together, the pressing action being carried out by at least one of (a) a pressing element and (b) a pressing element using a force of a weight of the pressing element.

13. The method according to claim 1, wherein multiple mechanical-electrical energy conversion systems are manufactured simultaneously in that the individual parts each have identical subareas or substructures which are situated next to each other and a distance apart and which are connected to each other in a common joining operation to form the multiple energy conversion systems, which are subsequently separated.

14. The method according to claim 1, wherein a spacing sheet is introduced into the assembly device prior to joining the support structure and the piezoelectric element.

15. The method according to claim 1, the method further comprising:
applying pressure to the first individual part, the positioned second individual part, and the positioned third individual part.

16. The method according to claim 15, the method further comprising:
removing the first individual part, the positioned second individual part, and the positioned third individual part from the assembly device after pressure has been applied.

17. The method according to claim 1, the method further comprising:
applying an adhesive to a portion of one side of the second individual part; and
applying the adhesive to a portion of one side of the third individual part.

18. The method according to claim 17, wherein the positioning of the second individual part on the planar surface formed by the first individual part in the assembly device is performed with the portion of the second individual part having the adhesive facing the first individual part, and wherein the positioning of the third individual part on the planar surface formed by the second individual part in the assembly device is performed with the portion of the third individual part having the adhesive facing the second individual part.

19. A method for manufacturing at least one mechanical-electrical energy conversion system, comprising:
positioning multiple individual parts in an assembly device and joining the parts together in joining areas in the assembly device,
wherein at least some of the individual parts are first formed to have a matching outer contour and are positioned and joined in the assembly device, and after being joined, at least one individual part is cut in its outer contour,
wherein the at least one individual part to be cut includes at least one of (a) a predetermined cutting location and (b) a predetermined cutting location in the form of a connecting web, and
wherein the individual parts include a piezoelectric element, a support structure, and a seismic mass.

20. A method for manufacturing at least one mechanical-electrical energy conversion system, comprising:
positioning multiple individual parts in an assembly device and joining the parts together in joining areas in the assembly device,
wherein the individual parts include a positioning aid for positioning in the assembly device,
wherein the assembly device has a positioning aid counterpart which at least one of (a) interacts with the positioning aid of the individual parts and (b) interacts with the positioning aid of the individual parts in a manner matching the positioning aid, and
wherein the individual parts include a piezoelectric element, a support structure, and a seismic mass.

21. A method for manufacturing at least one mechanical-electrical energy conversion system, comprising:
positioning multiple individual parts in an assembly device and joining the parts together in joining areas in the assembly device,
wherein the individual parts are connected using at least one of (a) welding, (b) laser welding, (c) ultrasonic welding, and (d) gluing using an adhesive,
wherein to join the at least two individual parts using the adhesive, a spacer is inserted into the assembly device prior to joining, the spacer being used to at least one of (a) define a distance between the two individual parts and (b) maintain a minimum distance between the two individual parts during joining, and
wherein the individual parts include a piezoelectric element, a support structure, and a seismic mass.

22. A method for manufacturing at least one mechanical-electrical energy conversion system, comprising:
positioning multiple individual parts in an assembly device and joining the parts together in joining areas in the assembly device,
wherein the support structure and the piezoelectric element are joined together using an electrically conductive adhesive and an electrically non-conductive adhesive, and
wherein the individual parts include a piezoelectric element, a support structure, and a seismic mass.

* * * * *